United States Patent [19]

Gammelin

[11] Patent Number: 5,196,667
[45] Date of Patent: Mar. 23, 1993

[54] SOLDERING AND DESOLDERING DEVICE

[76] Inventor: Peter Gammelin, Im Binzig 14, D-6948 Wald-Michelbach, Fed. Rep. of Germany

[21] Appl. No.: 466,316
[22] PCT Filed: Sep. 8, 1988
[86] PCT No.: PCT/EP88/00812
§ 371 Date: Jun. 27, 1990
§ 102(e) Date: Jun. 27, 1990
[87] PCT Pub. No.: WO89/04589
PCT Pub. Date: May 8, 1989

[30] Foreign Application Priority Data

Apr. 11, 1987 [DE] Fed. Rep. of Germany ....... 3737457

[51] Int. Cl.⁵ .................... B23K 1/005; B23K 1/012
[52] U.S. Cl. ................ 219/85.12; 228/230; 239/135; 239/437; 239/455; 239/502; 392/379; 392/408
[58] Field of Search ............... 219/85.12, 85.19, 121, 219/68; 392/408, 379; 228/180.2, 56, 59, 227, 230; 239/135, 451, 455, 502, 505, 507, 509, 437

[56] References Cited

U.S. PATENT DOCUMENTS

| | | | |
|---|---|---|---|
| 3,020,714 | 2/1962 | Eggers et al. | 239/455 |
| 3,194,014 | 7/1965 | Wilson, Jr. | 239/455 |
| 3,226,768 | 1/1966 | Zelewsky et al. | 239/455 |
| 3,267,249 | 8/1966 | Veth . | |
| 3,283,124 | 11/1966 | Kawecki . | |
| 3,457,386 | 7/1969 | Costello . | |
| 3,516,155 | 6/1970 | Smith . | |
| 3,520,055 | 7/1970 | Jannett . | |
| 3,586,813 | 6/1971 | Cruickshank et al. | 219/85.12 |
| 3,868,765 | 3/1975 | Hartleroad et al. | 228/180.2 |
| 4,156,124 | 5/1979 | Macken et al. | 219/121.68 |
| 4,321,738 | 3/1982 | Makhijani . | |
| 4,506,820 | 3/1985 | Brucker . | |
| 4,620,659 | 11/1986 | Holdway . | |
| 4,750,664 | 6/1988 | Furtek | 228/56.5 |
| 4,789,096 | 12/1988 | Dunn et al. . | |
| 4,812,620 | 3/1989 | Hayakawa et al. | 219/85.12 |
| 4,847,465 | 7/1989 | Toyama et al. . | |
| 4,854,696 | 8/1989 | Guez | 219/121.68 |
| 4,961,154 | 10/1990 | Pomerantz et al. | 364/522 |

FOREIGN PATENT DOCUMENTS

| | | |
|---|---|---|
| 1279150 | 10/1968 | Fed. Rep. of Germany . |
| 2343235 | 3/1975 | Fed. Rep. of Germany . |
| 59-29496 | 2/1984 | Japan . |
| 59-110462 | 6/1984 | Japan . |
| 60-57637 | 4/1985 | Japan ............... 219/85.12 |
| 62-296958 | 12/1987 | Japan . |
| 63-296296 | 12/1988 | Japan . |
| 2029750 | 3/1980 | United Kingdom . |
| 2098133 | 11/1982 | United Kingdom . |

Primary Examiner—Geoffrey S. Evans
Attorney, Agent, or Firm—Keck, Mahin & Cate

[57] ABSTRACT

A device for making or undoing welds between a component with several galvanic connections and a support is particularly suited for surface mounting. In order to direct a stream of hot gas or infrared radiation accurately onto the connections of the component and corresponding weld surfaces, a mask is provided which has openings that exactly match the configuration of the weld surface. Preferably, in the case of hot-air operation, a light source is arranged behind the mask in such a way that the predetermined pattern is reproduced exactly on the substrate in the form of points of light for positioning purposes. In one embodiment, the mask comprises two pairs of horizontally adjustable shields, the two pairs of shields being arranged at an angle of 90 degrees, the shields being made of a material of low thermal conductivity.

5 Claims, 5 Drawing Sheets

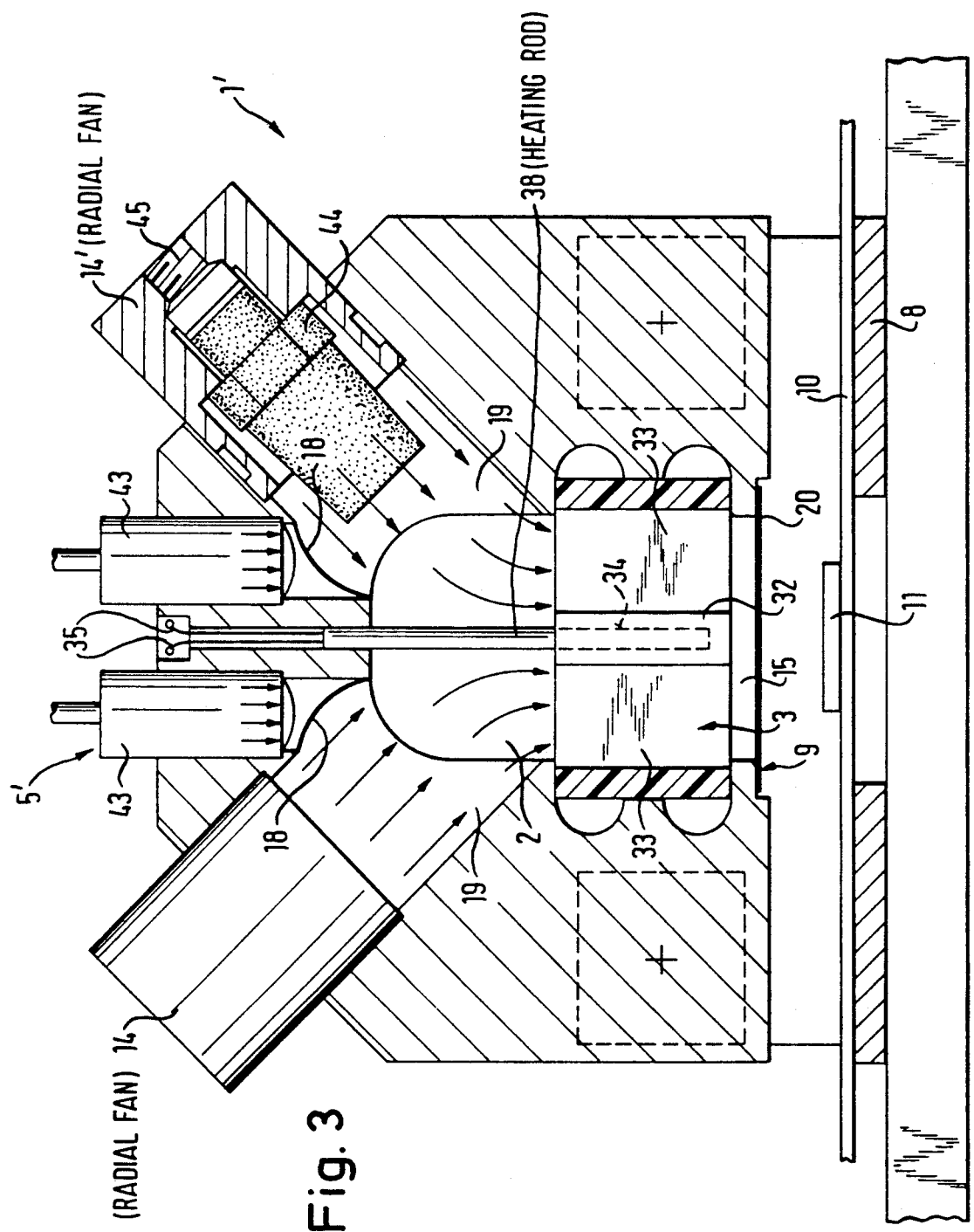

SOLDERING AND DESOLDERING DEVICE

The invention relates to a device for making or undoing solder connections or joints between an electronic component, e.g. a SMD component provided with several connections, and a component carrier, with a heat source spaced from the solder connection, by means of which a hot air jet and/or stream of infrared energy is directed onto the solder connection and with a mask for defining the jet or energy stream.

As is known, electronic assemblies typically comprise a rigid or flexible support provided with conductors and onto which are soldered electronic components. Such components may be plug-in connecting pins for a so-called plug-in mounting which, in the support, are soldered in fastening holes and in through-connection holes, or components which are directly soldered onto the surface of the conductors for mechanical and electrical connection. Thus, the conductors do not have to be perforated or broken for receiving each component. An assembly made by the latter technology is known as surface mounted assembly (SMA). For particular applications, it is also conventional practice to use a mixed loading or insertion with plug-in and surface mounted components.

The device is used for surface mounting special surface mounted devices (SMDs), such as resistors, capacitors, diodes, transistors, integrated circuits and chip carriers. Unlike the components provided with pin connections, these components have connecting surfaces or short contact legs or members, which are directly soldered, i.e., without connecting wires, to the printed circuit board.

One soldering method usable for SMA technology is reflow soldering. A hot gas dryer is frequently used as the heat source. The hot air jet directed onto the soldering point melts the soldering tin or paste applied there.

Automatic loading or insertion machines are typically used, in particular, to produce SMA assemblies. These allow large-scale production. However, the purchase price and operating costs of such automatic machines are so high that it is not possible to economically deal with small runs.

Using reflow soldering, means are known for the production of small runs, for mixed loading, for loading or modifying individual printed circuit boards or for the replacement of individual components, in which hot air is blown by means of nozzles onto the particular component. Admittedly the jet guidance can be adapted to different component shapes by different, interchangeable nozzle inserts. However, as a result of considerable spreading of the air jet, the complete component is located in the hot air jet and, therefore, all of it is heated. As a result of the non-uniform heat absorption in the different component metals such as metal, ceramic and plastic, a risk arises that thermal stresses and hair cracks occur, which can have a disadvantageous influence on the operational reliability. Moreover, in view of the large number of different component shapes, it is necessary to purchase and furnish a large number of nozzle inserts. Insert replacement also provides relatively long changeover times.

EP-A-O 0 233 125 and DE-B-1 279 150 disclose devices for making and undoing soldered connections between electronic components and a component carrier, in which a hot air jet is directed onto the soldered connection and a mask is used for defining the hot air jet. The known device also has a movable mask carrier. It is formed by the casing receptacle fitted in transversely displaceable manner over the component carrier.

The object of the invention is to provide a means of the aforementioned type which permits a precise action on the soldered connections and component connections without directly thermally loading the other components and which also may easily and rapidly be handled.

A basic principle of the invention is that the heat ray is subdivided into individual partial rays which are directed in a positionally correct manner onto the connecting surfaces, leads and pins, so that heating is exclusively limited to these points. As the mask can be manufactured in a ratio of 1:1 to the component dimensions, an extremely precise ray guidance is achieved. Fundamentally, the mask need not be restricted to an individual component. It is obviously possible to take into account a configuration with several components.

The mask can be replaced in a simple and speedy manner, since several masks are located on a flexible strip. There is a wind off/up reel for the flexible strips. The arrangement of these strips on reels leads to the advantage that a large number of different masks can be stored in a space-saving manner. Alternatively, it can be appropriate to arrange several masks on a rotary plate or table. This measure leads to particularly short access times. Copper-lined kapton foil and thin sheet metal are particularly suitable as flexible mask materials. In the case of the first-mentioned material, the configuration of holes can be produced particularly simply by a photochemical process, such as is known for the production of printed circuit boards. The thin metal sheet can be worked by punching, drilling or laser cutting.

Ceramic material is also suitable and this has the advantage that it can be worked with relatively simple means. It can also be appropriate to bring about the replacement of the individual masks with the aid of a change frame, which is brought into the desired position in a sliding guide.

The association and choice of the individual masks for the components being worked is facilitated in that each mask is provided with an identification mark and in that the apparatus is provided with a display/reading device for the mark. The individual masks can be identified by an operator or by an electrooptical reader.

A substantially automatic mask change is made possible by a stepping motor which cooperates with the reader and an electronic control. A particularly good ray or jet guidance is achieved when a known hot air dryer is used as the heating element. A pulse-like hot air action can be achieved when compressed air is used as the heat carrier. This ensures a particularly precisely defined heat action.

The heating of a gas serving as the heat carrier appropriately takes place in a heating chamber with a heating element comprising a web with ribs arranged on both sides and into which are inserted several cylindrical heating rods. If the heating element is also to serve as a heat accumulator, it is preferably made from metal. Instead of this, and with a view to a short response time and energy saving, it is advantageous to make the heating element from a ceramic material.

In place of the inserted heating bars, it can also be appropriate for the material to place or press the heating coils onto the material. Many different heating coil shapes and distributions are possible with the aid of the sintering process.

Preferably, several independently controllable heating wires are used for heating regulation purposes. In accordance with the particular requirements, which can be dependent on the material or assembly, the number of heated wires is varied. In order to ensure that the casing does not serve as a heat accumulator and for shortening the response time, it is proposed to thermally insulate the casing. In a particularly simple manner, this is achieved by making the casing from ceramic material, which can also be easily mechanically worked.

The precise positioning of the components below the mask is simplified by arranging a light source behind the mask, so that the position of the latter is indicated by a light mark. It is not fundamentally necessary for additional openings to be provided in the mask for light marking. Instead the light passes through the same mask openings as the heat ray. Thus, the light markings are the same as the surface subject to the action of the heat ray. Thus, if the particular component connections are made to coincide with the light markings, the component is correctly positioned. Thus, working on components is extremely rational, without complicated positioning means being needed.

Constructionally, it is particularly simple for the light source, a heating element provided with ribs or openings, and the mask to be arranged in one line. The heating element brings about a light diffusion, so that uniform, diffuse light passes out of the mask, which is particularly suitable for position indication purposes.

It can also be advantageous to position the light source laterally alongside the heating element. In all cases it is advantageous for there to be a light chamber in which the light is diffused in front of the mask. This chamber consequently has the effect of a diffusion disk, without the passage of the heat ray being impeded. The light can also be passed into this diffusion chamber via light-conducting materials.

If an infrared emitter is used as the heat source in place of a heating element over which a gas is passed, then a further advantage of the invention is that positioning can take place with the aid of the IR-rays passing out of the mask and without additional constructional expenditure.

The invention is described in greater detail hereinafter relative to three embodiments and the attached drawings, in which:

FIG. 3 is a diagrammatic, perspective, vertical, longitudinal section through a second soldering device;

Figure 7:
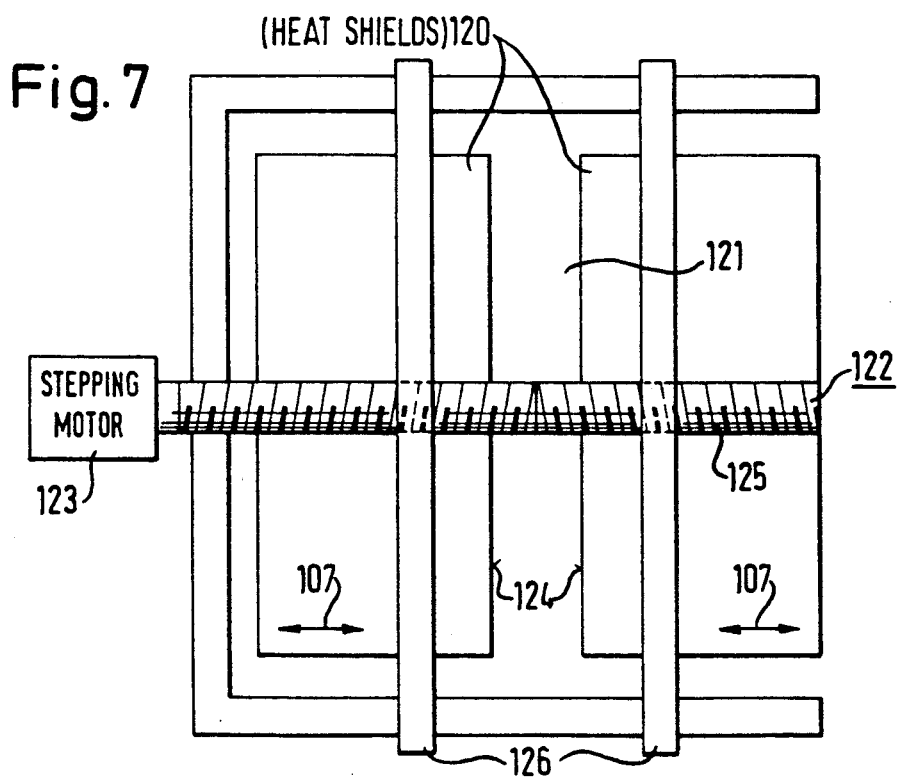
Figure 8:
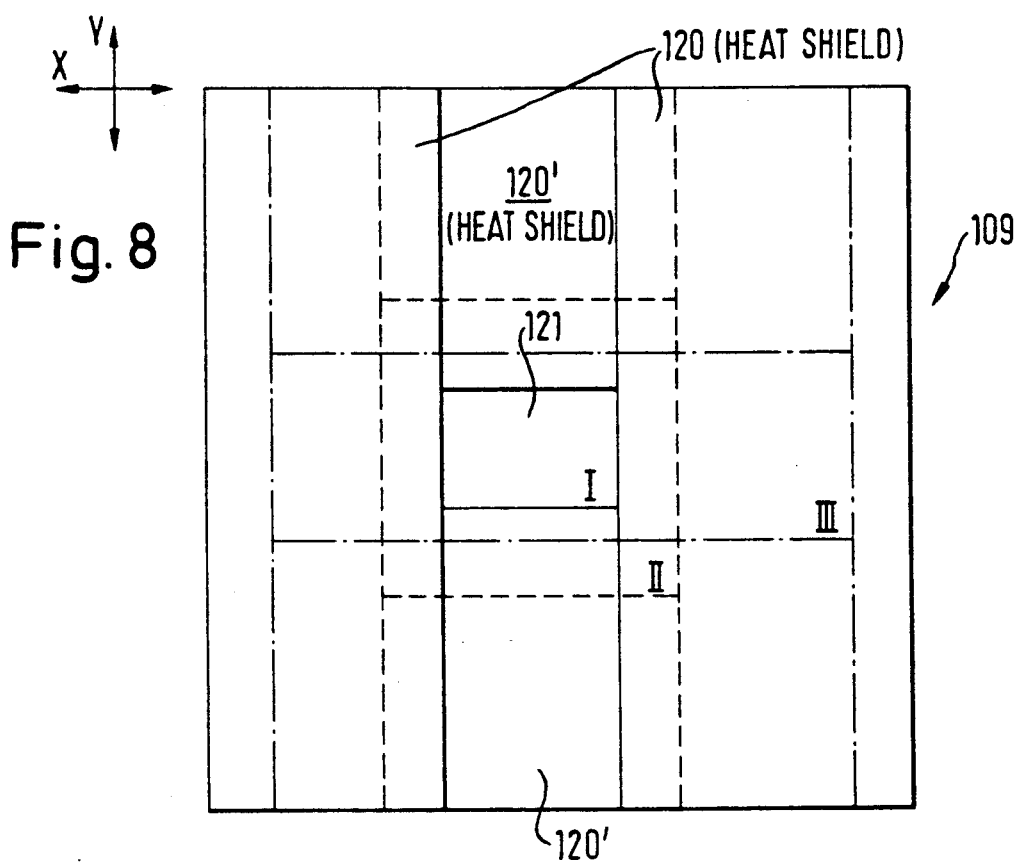
Figure 9:
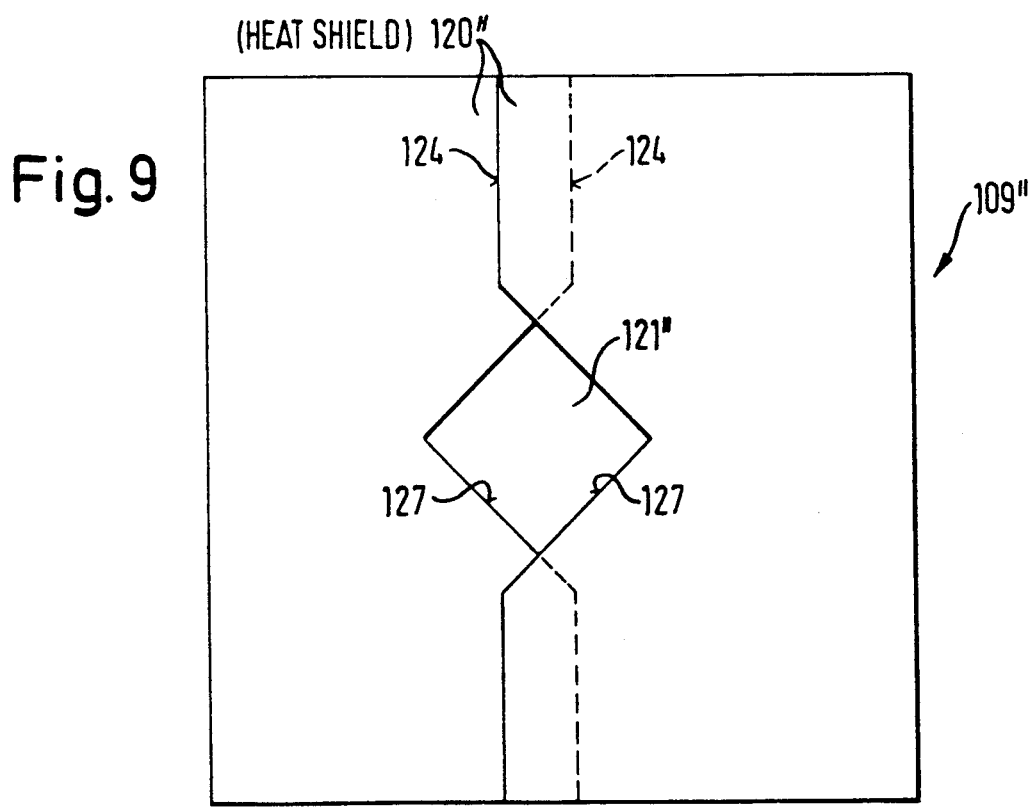

FIGS. 7 to 9 each diagrammatically shows an example of a mask.

Figure 1:
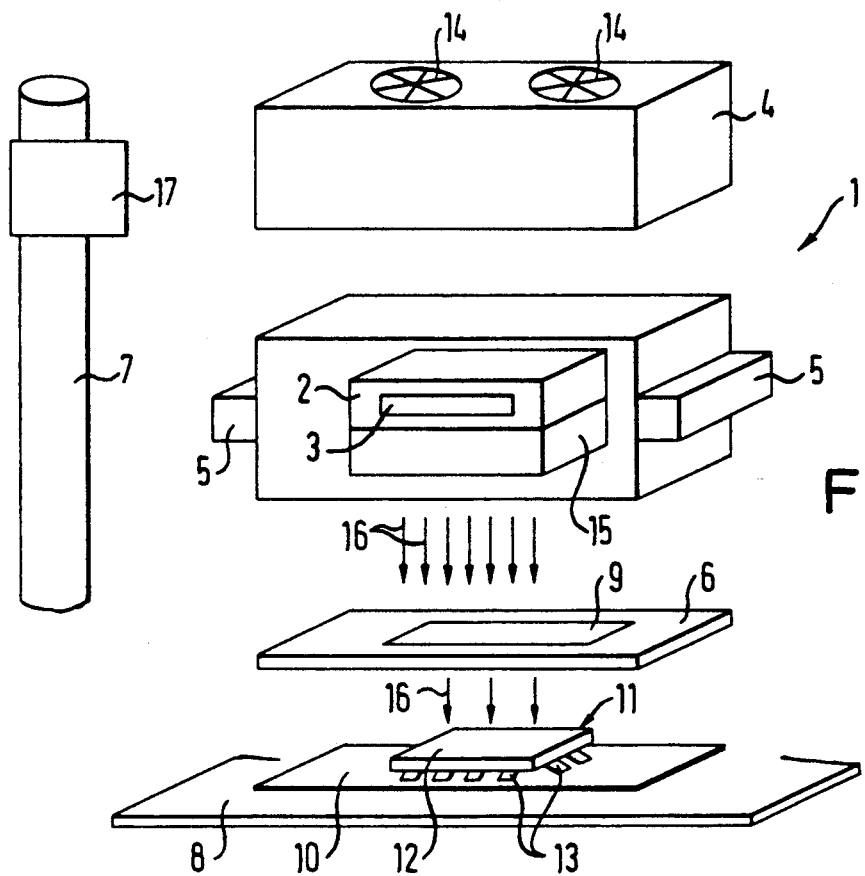
FIG. 1 is a perspective exploded view of a first soldering device.

A soldering device 1 according to FIG. 1 comprises a heat source, which comprises a heating chamber 2 with heating elements 3, a fan 4, two light source 5, a mask mounting support 6 and a vertically adjustable stand 7, with which the soldering device 1 is mounted in vertically displaceable manner relative to a slide 8 movable in a plane. A mask 9 made from heat resistant material is located in the mask support 6.

In known manner, an assembly carrier 10 with electronic components is fixed to the slide 8. In order to make the representation easy to understand, only a single component is shown on a greatly increased scale on the carrier. It comprises a parallelepipedic plastic or ceramic body 12, which receives an electronic circuit, as well as a plurality of metallic connecting members or legs 13, with which the component 11 is mounted on the surface of the component carrier 10. The carrier is of a known configuration, and is called a SMD assembly.

The fan 4, which comprises one or more radial fans 14, sucks in external air or an inert gas, and this gas is moved past the heating elements 3 in the heating chamber. In the flow direction, a dispersion chamber 15 is connected to the heating chamber and at its outlet is located the mask support 6 with the mask 9. Thus, the hot air passes out exclusively via the mask 9. The mask 9 contains the exact positions of the soldered surfaces between the component 11 and the assembly carrier 10 in the form of bores, slots or a complete contour. In other words, the mask openings constitute a precise image of the lead configuration of the component 11. As the hot air moves substantially linearly and radially after passing out of mask 9, with a correspondingly precise positioning of the soldering device 1, the individual hot air jets pass directly onto the soldered surfaces on the legs 13.

The positioning is facilitated in that via light sources 5, light is passed into the dispersion chamber 15 in such a way that it serves as a non-directional, uniformly irradiating light source. Parallel light beams pass out of the openings of mask 9 and are oriented precisely at right angles relative to slide 8 or assembly carrier 10. The path of the light beam 16 is identical with the hot air jets passing out.

The light beams 16 form light spots on the component 11 or on the assembly carrier 10, so that through a lateral displacement of slide 8, a precise positioning of the legs 13 below mask 9 can be obtained.

The soldering device 1 is placed as close as possible below component 11, in that it is vertically moved by means of a slide 17 guided on stand 7.

Figure 2:
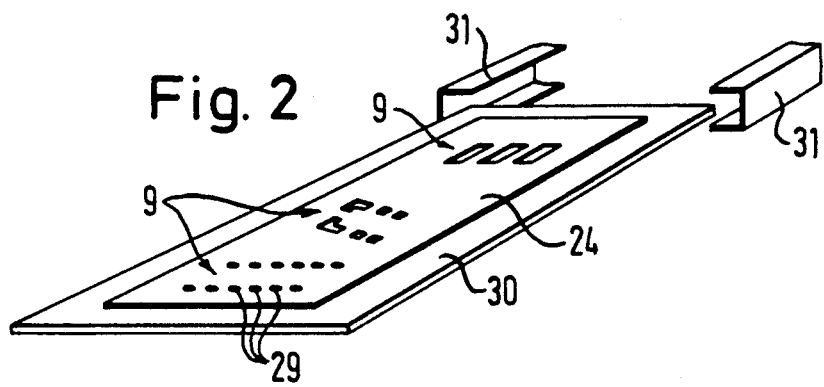
FIG. 2 is a diagrammatic and perspective view of a mask for use in the first soldering device according to FIG. 1.

In the following drawings the same parts are given the same reference numerals as in FIG. 1. m FIG. 2 perspectively shows a strip 24 of a heat-resistant foil with several masks 9. The holes 29 of the individual masks correspond true-to-scale with the arrangement of the legs of different components. Strip 24 is held in a rigid frame 30, so that it is inserted in a rail 31 and can be moved there for positioning the individual masks 9. Rail 31 is a component of the mask mounting support 6 of FIG. 1.

FIG. 3 shows, in a vertical longitudinal section, a second soldering device 1', which differs in constructional details from the soldering device 1 according to FIG. 1. In the presently represented embodiment the light source 5' comprises several halogen emitters 43 located above the heating chamber 2. The halogen emitters 43 on the light exit side are separated by means of a light-permeable diffusion disk 18, e.g., of heat-resistant milk glass, from the heating chamber 2 below the same. Admittedly the heating elements 3 partly shadow the light source 5', but as a result of the numerous light deflections and reflections on elements 3 and the walls of heating chamber 2, an adequately uniform light intensity for the positioning of component 11 is obtained.

In this embodiment, the radial fans 14 or 14' are positioned with a certain gradient laterally above the heating chamber 2. The sucked in air passes via passages 19 into the heating chamber 2 and the diffusion disks 18 also serve as a guide surface and are given a convex shape to assist this function.

FIG. 3 shows, on the left-hand side, a conventional radial fan 14. On the right-hand side is shown in cross-section an alternative 14', which can be used if compressed air is to be introduced into the heating chamber 2. It has a hose connection 45 for a not shown external compressed air source. This is followed in the flow direction by an insert 44 made from porous sintered material for compressed air distribution purposes.

The heating elements 3 comprise a parallelpipedic ceramic body with a central longitudinal web 32, which is at right angles to the plane of the drawing. On both sides it carries several ribs 33 past which flows the sucked in air. In the web there are several cylindrical recesses 34, which, in each case, have a heating rod 38 comprising a heating wire 35 burned into a ceramic tube. The heating rods 38 can be easily replaced.

Together with a plurality of other masks, having hole configurations coinciding with the soldered surfaces of different components, mask 9 is located on a flexible foil 20, e.g., a copper-lined kapton foil or a metal sheet. Through a movement of foil 20 at right angles to the drawing plane different masks can be brought into the operating position below heating chamber 2.

Such a foil can carry an adequate number of different masks and configurations of holes and take into account the requirements of both manufactures and users.

Figure 4:
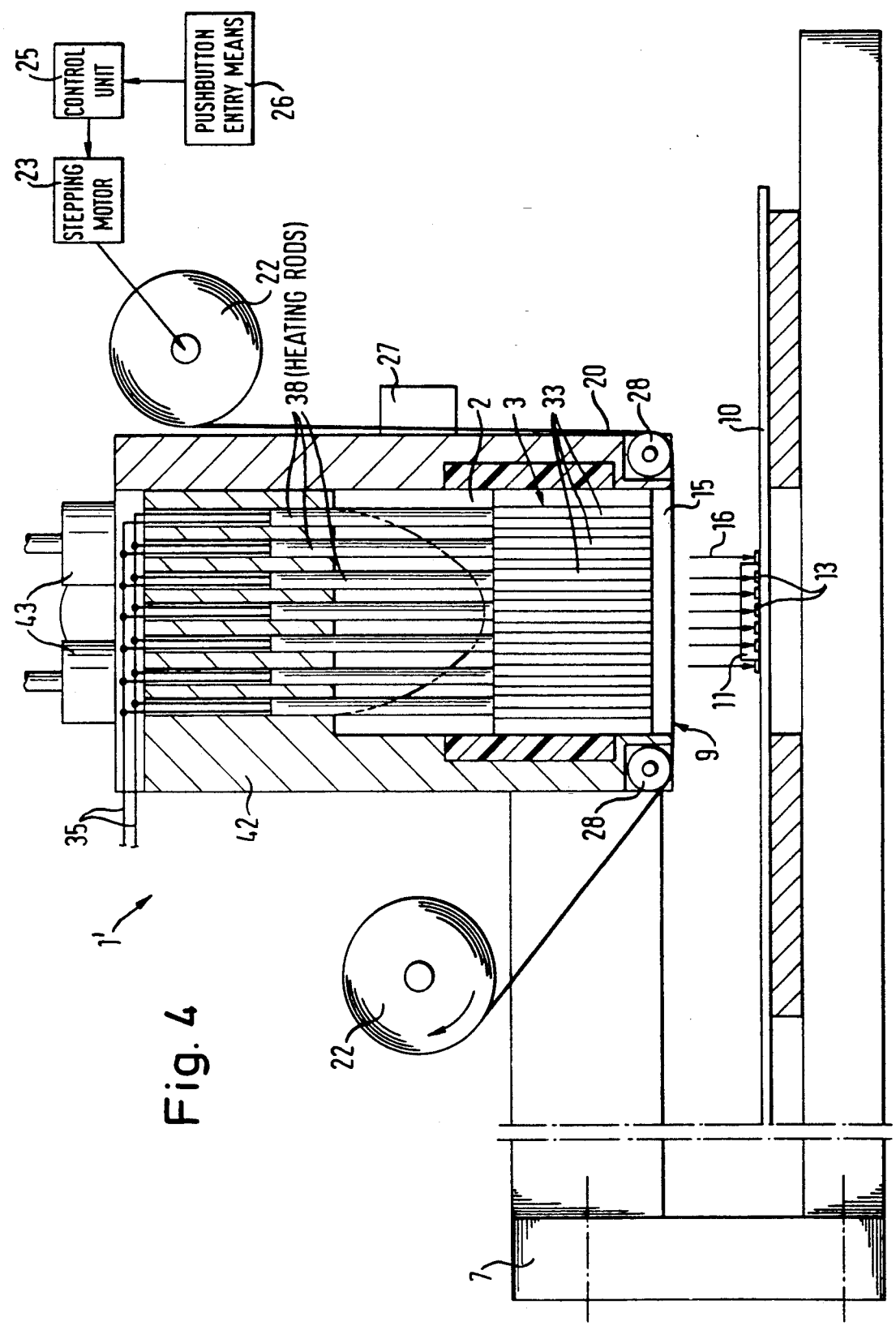
FIG. 4 is a diagrammatic vertical cross-section through the second soldering device.

As shown in FIG. 4, the foil 20 is carried by a wind-off and wind-up reel 22. The two reels 22 can be constructed in such a way that they can be manually operated, e.g., by means of not shown knurled nuts, which are connected in non-rotary manner to the two reels 22. Alternatively, a motor drive can be provided. The motor drive, which preferably comprises a stepping motor 23, is controlled by the operator via a pushbutton entry means 26 and a following control unit 25. By means of an optoelectronic reader 27, whose sensor, e.g., comprises a diode line, the mask 9 is located in the working position below the heating chamber 2 is established. For this purpose, there is a corresponding coding on the foil 20. In addition, there can be uncoded information on the foil, which can be read off by the operator at a window past which the foil 20 is moved. Particularly, in the case of a manual adjustment of the wind off/up reels 22, such a display is helpful.

Figure 5:
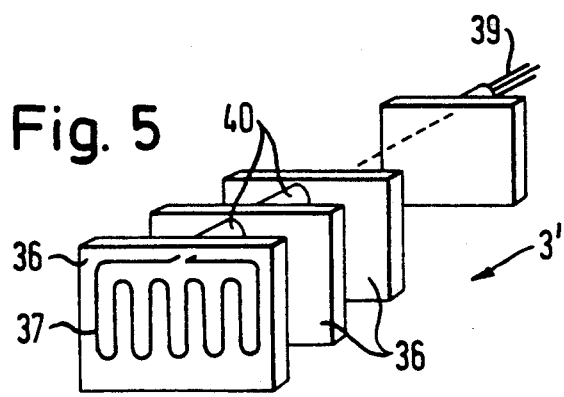
FIG. 5 is a diagrammatic, perspective view of a heating element.

Guide pulleys 28 are provided on casing 42 for guiding the foil 20. An alternative heating element 3' to the heating element 3 shown in the two preceding drawings is perspectively illustrated in FIG. 5. It comprises several parallel ceramic plates 36, onto which is burned, in each case, a heating coil 37 using the thick or thin film process. The ceramic plates 36 are interconnected by spacers 40 and are combined into a unit. The connections 39 of the individual heating coils are led outwards in the interior of the spacers 40, so that they can be switched in independently of one another.

Figure 6:
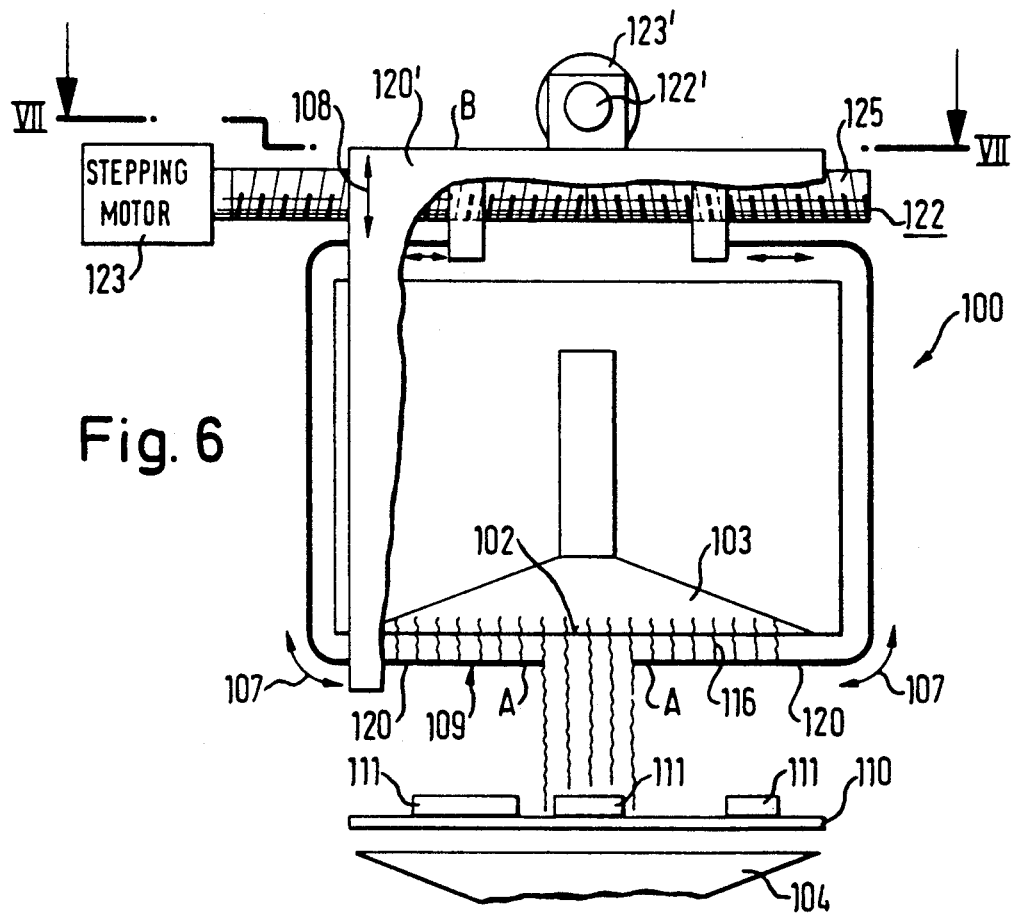
FIG. 6 is a diagrammatic view of a third soldering device.

Another alternative of a soldering device 100 is shown in FIG. 6. The heat source comprises an infrared emitter 103 with a largesurface emission exit 102 directed downwards onto a printed circuit board 110. The diagrammatically represented infrared emitters are designated 116. The emission exit 102 can be bounded by a continuously variable mask 109. For this purpose, the mask 109 comprises several displaceable shields 120, which are arranged in pairs. They comprise a thin, flexible, heat-resistant, metallic foil material. In order to reduce heat dissipation, they have a poor thermal conductance. Foils with a thickness of approximately 0.1 mm are suitable. A first pair A is passed around the emitter 103 according to arrow 107 from above until located in front of the emission exit 102. A second pair B, only one shield of which is partly shown, is moved at right angles thereto according to arrow 108. The shields 120, 120' are opened or closed pairwise in opposing manner by means of stepping motors 123 or 123' and crosswise-oriented spindle drives 122 or 122'.

Below the printed circuit board 110 is provided a further infrared emitter 104, which is directed onto the underside of the plate. Thus, the solder points on the plate surface are preheated to a predetermined temperature, which is below the temperature critical for the components 111. The additional heat required for soldering or solder removal of components 111 is supplied in planned manner by means of the infrared emitters 103.

As illustrated in FIGS. 6 to 9, the shields 120, 120' are arranged pairwise in such a way that they either increase or decrease the size of a mask window 121, 121" in the case of an antiparallel movement, in that their edges 124 are moved towards or away from one another. This is achieved in that the driving shafts of the spindle drives 122, 122' engage, by means of oppositely directed threads, with two shield fastenings 126 associated with the two shields 120, 120'. Shields 120, 120' are guided in horizontal rails or slots, which are arranged in the movement direction laterally alongside the emission exit 102.

FIG. 7 shows a part sectional plan view of the soldering device 100 along line VII—VII in FIG. 6. To make the drawing easy to understand, the infrared emitter 103 is not shown, so that the edges 124 of shield 120 are clearly visible. If the horizontal shield fastenings 126 are, e.g., moved outwards, then the edges 124 move inwards and reduce the size of the mask window 121.

FIG. 7 only shows a single, antiparallel movable pair of shields 120 and associated stepping motor 123/spindle drive 122. If, in practice, only one such shield pair with parallel edges 124 was provided, then the size of the mask window 121 could only be varied in one direction.

However, in order to bring about both a lengthwise and transverse regulation, according to FIG. 8, a further shield pair 120' is provided. The movement directions of the two shield pairs 120, 120' are at right angles to one another. The operation and adjustment of each shield pair take place independently in each pair, and each pair includes a separate stepping motor and spindle drive, as shown in FIGS. 6 and 7.

As a result of random, continuous displacement both in the X and Y-directions, it is possible to obtain exactly predeterminable mask windows 121. The mask window is always positioned centrally with respect to the emission exit 102. As a result of the independent control of the pairwise-arranged shields 120, 120', it is possible to set both a square or rectangular window shape, so that the mask window 121 can be readily adapted to the contours of components 111 (FIG. 1). Thus, no fixed predetermined set of masks is required, which is particularly advantageous in view of future component configurations.

FIG. 8 shows, in an exemplified manner, three different positions I, II and III of the two pairwise-arranged shields 120, 120' displaceable in the longitudinal or transverse direction.

FIG. 9 illustrates an example for a continuously adjustable mask 109", which comprises two antiparallel-displaceable shields 120". The edges 124 of shields 120" determining the mask window 121" are not parallel to one another over the entire width thereof. They are, in fact, symmetrical to the centre axis in the movement direction with forwardly open slits 127, in such a way that the slits 127 of the two shields 120" combine to form the rectangular mask window 121". Obviously, the slit 127 can be given a different geometrical shape, if this is appropriate for adapting to the components to be worked. As a result of an antiparallel movement of the two shields 120" there is a bidimensional size increase or decrease of the mask window 121".

If the mask 109", which comprises two shields 120" and which has the basic idea which is described relative to FIG. 9, is combined with a further pair of shields movable at right angles thereto, the shape of the mask window 121" can be further varied.

In the case of computer-assisted operation, it is possible to store standard component sizes and then to operate, in a program-controlled manner, the individual stepping motors 123.

I claim:

1. A device for making and undoing soldered connections between an electronic component provided with several connections and a component carrier, comprising:
    a heat source for providing at least one of a hot air jet and a stream of infrared radiation; and
    a continuously adjustable mask, comprising at least two horizontally displaceable shields, providing a mask window;
    said heat source being arranged at a distance from the soldered connections, said continuously adjustable mask being arranged between said heat source and said electronic component, said mask window being adaptable to contours of said electronic component, the at least one of the hot air jet and steam of infrared radiation being provided by said heat source and directed onto said connections, the continuously adjustable mask being made from a material with a low thermal conductivity, wherein the at least two horizontally displaceable shields have parallel edges perpendicular to a direction in which said displaceable shields move, said shields having forwardly open slits combining to form a rectangular mask window.

2. A device for making and undoing soldered connections between an electronic component provided with several connections and a component carrier, comprising:
    a heat source for providing at least one of a hot air jet and a stream of infrared radiation; and
    a continuously adjustable mask providing a mask window;
    said heat source being arranged at a distance from the soldered connections, said continuously adjustable mask being arranged between said heat source and said electronic component, said mask window being adaptable to contours of said electronic component, the at least one of the hot air jet and the stream of infrared radiation being provided by said heat source and directed onto said connections, the continuously adjustable mask being made from a material with a low thermal conductivity, wherein the continuously adjustable mask comprises two pairs of horizontally displaceable shields, each pair having parallel edges, the two pairs being arranged at an angle of 90° to allow perpendicular movement thereof, the operation and adjustment of one pair of shields are independent from the operation and adjustment of the other pair of shields, and the shields of each pair of shields are arranged so that they increase and decrease the size of the mask window by simultaneous movement in opposite directions.

3. A device according to claim 2, wherein the horizontally displaceable shields are arranged independently of each other for operation and adjustment.

4. A device according to claim 2, and further comprising a stepping motor and a memory containing particulars for different mask sizes for standard component sizes, the stepping motor displacing said shields in program controlled manner.

5. A device according to claim 2, and further comprising a spindle drive for each of said horizontally displaceable shields.

* * * * *